United States Patent
Chuang et al.

(10) Patent No.: US 7,323,908 B2
(45) Date of Patent: Jan. 29, 2008

(54) CASCADED PASS-GATE TEST CIRCUIT WITH INTERPOSED SPLIT-OUTPUT DRIVE DEVICES

(75) Inventors: Ching-Te Chuang, South Salem, NY (US); Jente B. Kuang, Austin, TX (US); Hung C. Ngo, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 140 days.

(21) Appl. No.: 11/260,571

(22) Filed: Oct. 27, 2005

(65) Prior Publication Data

US 2007/0096770 A1   May 3, 2007

(51) Int. Cl.
*H03K 19/0175*   (2006.01)
*H03K 19/094*   (2006.01)
*H03K 3/03*   (2006.01)

(52) U.S. Cl. ............... 326/83; 326/81; 326/87; 326/113; 331/57

(58) Field of Classification Search ........... 326/81, 326/83, 87, 113
See application file for complete search history.

(56) References Cited

U.S. PATENT DOCUMENTS

| | | | | |
|---|---|---|---|---|
| 6,188,293 B1* | 2/2001 | Miyagi et al. | | 331/57 |
| 6,958,659 B2* | 10/2005 | Nakajima | | 331/57 |
| 7,071,736 B2* | 7/2006 | Wikstrom | | 326/95 |
| 7,190,233 B2* | 3/2007 | Bhushan et al. | | 331/44 |

* cited by examiner

*Primary Examiner*—Rexford Barnie
*Assistant Examiner*—Christopher Lo
(74) *Attorney, Agent, or Firm*—Mitch Harris, Atty at Law, LLC; Andrew M. Harris; Casimer K. Salys

(57) ABSTRACT

A cascaded pass-gate test circuit including interposed split-output drive devices provides accurate measurement of critical timing parameters of pass gates. The rise time and fall time of signals passed through the pass gate can be separately measured in a ring oscillator or one-shot delay line configuration. Inverters or other buffer circuits are provided as drive devices to couple the pass gates in cascade. The final complementary tree in each drive device is split so that the only one of the output pull-down transistor or pull-up transistor is connected to the next pass gate input, while the other transistor is connected to the output of the pass gate. The result is that the state transition associated with the device connected to the pass gate input is dominant in the delay, while the other state transition is propagated directly to the output of the pass gate, bypassing the pass gate.

15 Claims, 4 Drawing Sheets

CASCADED PASS-GATE TEST CIRCUIT WITH INTERPOSED SPLIT-OUTPUT DRIVE DEVICES

This invention was made with government support under PERCSII, DARPA NBCH3039004. THE GOVERNMENT HAS CERTAIN RIGHTS IN THIS INVENTION.

BACKGROUND OF THE INVENTION

1. Technical Field

The present invention relates generally to logical circuits, and more particularly to a test circuit having cascaded pass gate devices and associated methods for evaluating pass gate performance.

2. Description of the Related Art

Pass gates (or "transmission gates") are a common building block in logical circuits. For example, pass gates to provide access to storage elements in memory circuits, to implement branches paths in multiplexers/demultiplexers and to provide isolation of latch and other outputs with a lower device count than alternative tri-state and strict uni-directional logic implementations.

It is therefore desirable to provide a test circuit and method for measuring pass gate rise time and fall time performance under operating conditions that are as close to actual circuit loading conditions as possible. It is further desirable to provide such a circuit that can measure rise and fall times independently.

SUMMARY OF THE INVENTION

The objective of independently measuring rise and fall times under actual loading and operating conditions is achieved in a circuit and method of operating the circuit.

The circuit is a cascade of multiple pass gates with drive devices interposed between each pass gate and may be connected to form a ring oscillator, or may be used as a one-shot delay circuit. The drive devices have separate pull-down and pull-up outputs and one of the outputs is connected to the input of a next pass gate in the cascade, while the other output is connected to the output of the next pass gate. The result is that one state transition bypasses the pass gate, permitting separate measurement of rise time and fall time for the pass gates.

Additional loading circuits may be added that simulate the missing "off-state" device in the output of the drive device at one or both of the input and output of the pass gate (i.e., at the pull-up and/or pull-down outputs of the drive devices). A loading circuit comprising one or more off-state pass gates may be included at each pass gate output to simulate additional unselected pass gates in a multiplexer or other such circuit.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DESCRIPTION OF ILLUSTRATIVE EMBODIMENT

The present invention concerns a test circuit for evaluating performance of pass gates in order to facilitate design improvement and determination of operating margins. In particular, a mechanism for observing differences between the rise and fall times of the pass gates is provided by the present invention.

A ring oscillator or delay line is implemented by a cascade of pass gates with "split inverters" connecting the pass gates together. The split inverters generally are transistors that would form an inverter if their channels were commonly connected, but instead generally provide discrete "pull-up" and "pull-down" transistors (or a ladder of transistors), so that the two state transitions introduced at the output of the split inverters can be isolated. One output of the split inverters is used to introduce state transitions at the input of each pass gate, the other output is used to bypass the pass gate, introducing the opposite state transition at the pass gate output without the delay through the pass gate for the opposite transition. The result is that the rise time of the pass gate can be determined independent from the fall time.

Figure 1A:
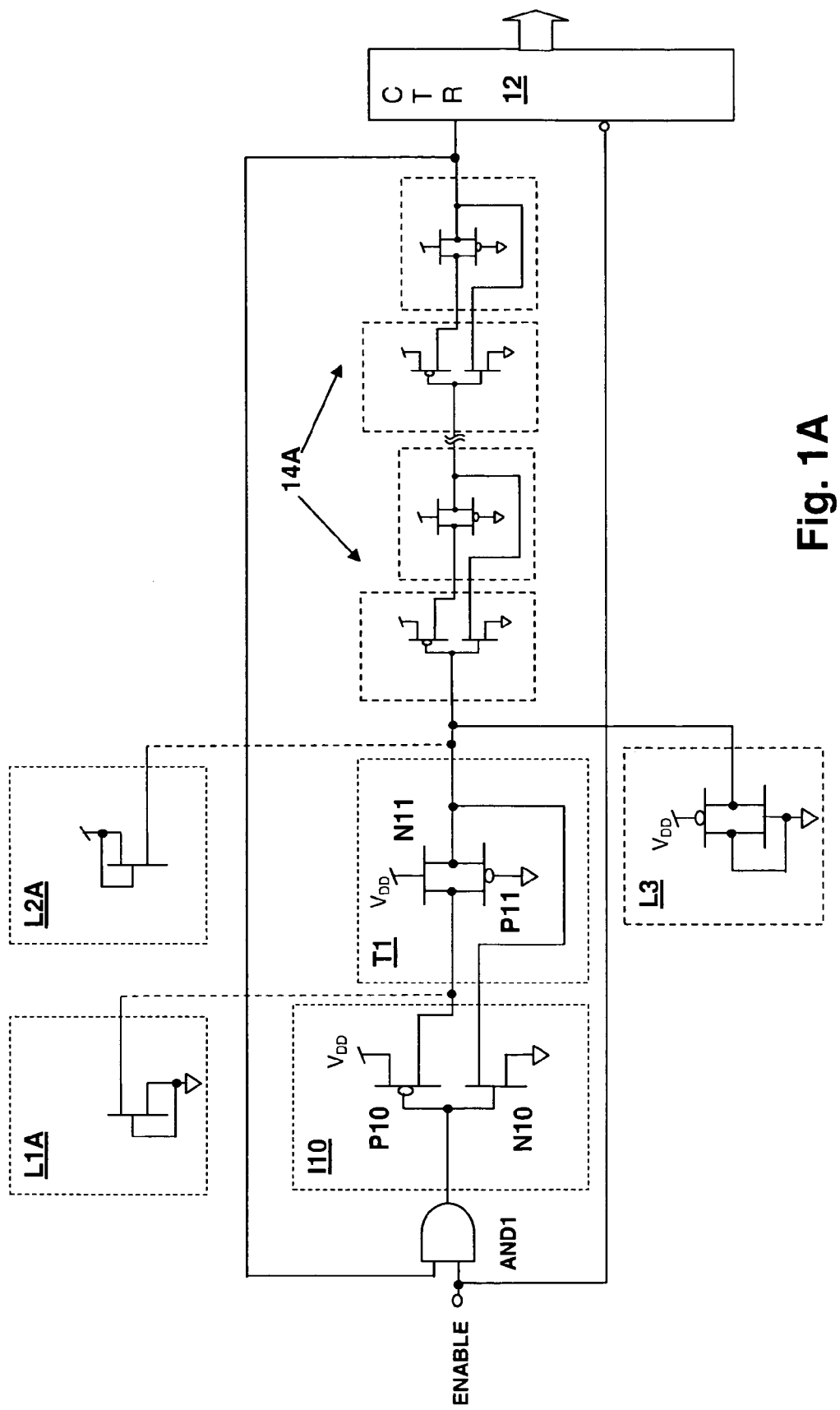
FIGS. 1A and 1B are schematic diagrams of test circuits in accordance with embodiments of the invention.

With reference now to the figures, and in particular with reference to FIG. 1A, a test circuit in accordance with an embodiment of the invention is shown. The test circuit includes a plurality of pass gates such as pass gate T1 with split inverters such as I10 coupling the pass gates in cascade. Split inverter I10 and pass gate T1 form a first stage and subsequent stages 14A carry state changes introduced at the input of the cascade by a logical AND gate AND1 (or other suitable stimulus circuit) to a measuring circuit, which in the depicted embodiment is a counter 12 that is used to count a frequency produced by the test circuit operated as a ring oscillator by virtue of feedback from the last one of stages 14A through AND gate AND1. Alternatively, the frequency may be measured by a frequency counter in an external test system connected to the test circuit. An ENABLE signal is also provided to start and stop the ring oscillator. Counter 12 may also alternatively represent a delay measurement counter driven by a reference clock and used to measure the time it takes for a state change to propagate through the cascaded delay line formed by the pass gate/drive device chain. If the delay line implementation is used, then the connection of split inverters I10 will be reversed at each stage, so that the delay is representative of only one of the two possible state changes.

Split inverter I10 includes electrically isolated N-channel device N10 and P-channel device P10 that provide independent pull-up and pull-down functions in response to the signal input to split inverter I10. The pull-up output provide by transistor P10 is applied to the input of pass gate T1, wherein transitions from a low voltage logic state to a high voltage logic state are passed through transistors P11 and N11 that provide parallel paths through pass gate T1 and have gate inputs connected to power supply rails corresponding to an enabled state of pass gate T1. While the pass gates shown in the depicted embodiment are two-transistor pass gates, it will be understood that the techniques described herein may be applied to single-transistor pass devices as well as pass gates having multiple cascaded pairs of transistors or single transistors, such as cascaded pass gate circuits used to construct pipelined logic functions.

Transitions from a high voltage logic state to a low voltage logic state are applied directly to the output of pass gate T1 by virtue of the connection of transistor N10 directly to the output of pass gate T1. All of subsequent stages 14A are constructed in a similar manner, so that the total delay for a low-to-high voltage logic transition is representative of the delay through N pass gates, where N is the number of stages and the total delay for the high-to-low voltage logic transition is representative of only the delay through the interconnects and drive circuits such as AND gate AND1, split inverter I10 and the split inverters of stages 14A. Thus, the test circuit of FIG. 1A represents a circuit for measuring the rise time through pass gate T1 without dependence on the fall time through pass gate T1.

The loading of the ring oscillator stages differs somewhat from the loading of a cascade of pass gates connected with unsplit inverters. The "off" device capacitance and other parasitics provided normally by transistor N10 are missing from the output of split inverter I1, because of the connection of N10 to the output of pass gate T1. Load circuit L1A provides an N-channel device wired in a permanently disabled state to compensate for the change in loading. Similarly, and as an alternative, loading can be introduced by a load circuit L2A translated to the output of pass gate T1. As a third alternative, a combination of load circuits L1A and L2A having appropriately sized devices can be used. Another load circuit L3 is formed by another pass gate, permanently wired in a disabled state. Load circuit L3 can be included to simulate the loading effect of disabled multiplexer branches in a multiplexer circuit. Multiple disable branches can be simulated by sizing the devices within load circuit L3 to increase the loading, or by including multiple load circuits L3. Although not shown for clarity of illustration, if load circuits L1A, L2A and L3 are included at the first stage of the test circuit, then identical load circuits will also be provided at each of subsequent stages 14A.

Figure 1B:
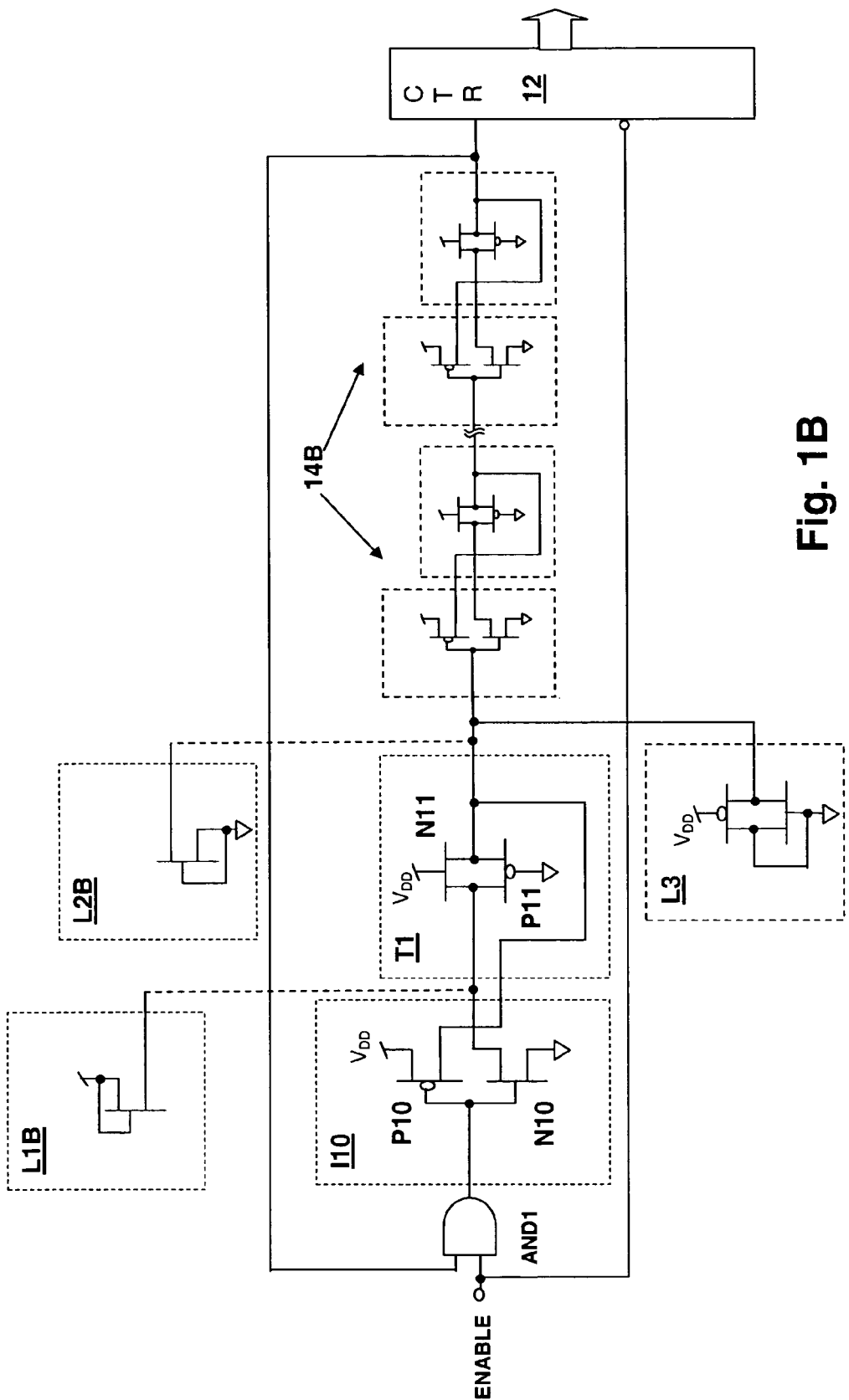

Referring now to FIG. 1B, another test circuit is shown that is used to measure the fall time of pass gate T1 independent of the rise time. As the circuits of FIG. 1A and FIG. 1B are similar in function and structure, only differences between them will be described below. The output connections of split inverter I10 (and similarly the split inverter to pass gate connections of subsequent stages 14B) are reversed from those in the circuit of FIG. 1A. In particular, transistor N10 has a channel connection that is connected to the input of pass gate T1 and transistor P10 has a channel connection connected to the output of pass gate T1. The result is that the falling transition is propagated through pass gate T1 in the depicted test circuit and thus the fall time of pass gate T1 is measured independent of the rise time, rather than the rise time measurement provided by the circuit of FIG. 1A. Load circuits L1B and L2B have devices of opposite polarity and are connected to opposite supply rails with respect to corresponding load circuits L1A and L2A of FIG. 1A.

Figure 2A:
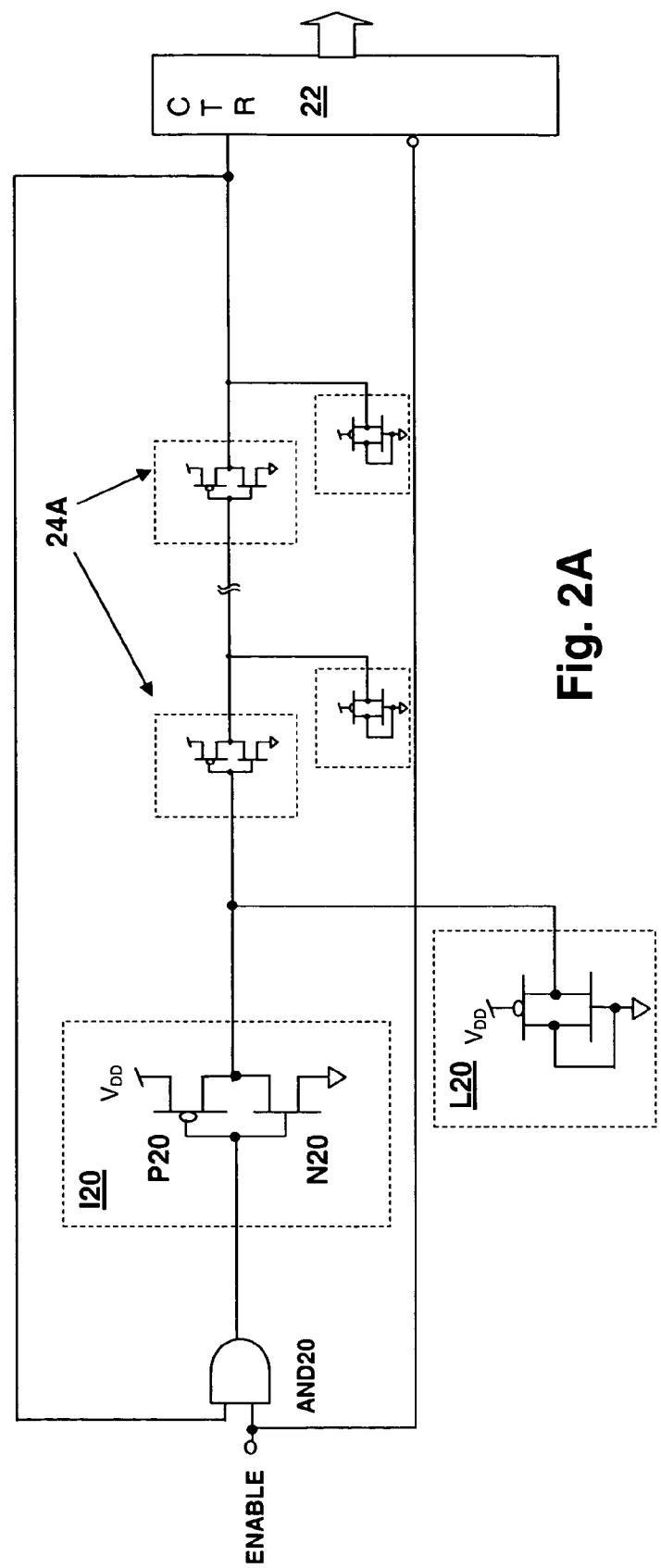
FIGS. 2A and 2B are schematic diagrams of reference test circuits that can be used to provide baseline data for use in a test method in accordance with an embodiment of the invention.

Referring now to FIG. 2A, a reference ring oscillator or delay test circuit that can be used to provide reference baseline delay information for a test method in accordance with an embodiment of the invention is shown. The construction of the reference test circuit is similar to that of the ring oscillator circuits of the present invention as described above, but rather than including cascaded pass gates, only full inverters I20 are cascaded, and the pass gates (including any additional load simulating "off" multiplexer branches) are simulated by load circuits L20. Subsequent stages 24A are again similar to the first stage formed by inverter I20 and load circuit L20 and a control logical-AND gate AND20 and counter 22 are included to match those in the test circuits of FIG. 1A and FIG. 1B, if such circuits were included. The measurement reference is provided by virtue of the identical delay path for the state change not propagated through pass gates T1 in the test circuits of FIGS. 1A and 1B.

If the total delay of the N-stage reference circuit is given by $N(t_{r0}+t_{f0})$ where $t_{r0}$ is the rise time and $t_{f0}$ is the fall time of each stage in the circuit of FIG. 2A and the delay through the N-stage circuits of FIGS. 1A and 1B are given by $N(t_r+t_{f0})$ and $N(t_{r0}+t_f)$, respectively, then the rise and fall time of pass gate T1 can be determined.

The difference between $t_r$ and $t_{r0}$ is given by $t_r-t_{r0}=[N(t_r+t_{f0})-N(t_{r0}+t_{f0})]/N$ and similarly the difference between $t_f$ and $t_{f0}$ is given by $t_f-t_{f0}=[N(t_{r0}+t_f)-N(t_{r0}+t_{f0})]/N$. If the ring oscillator frequency of the test circuit of FIG. 1A is $f_{1A}=1/[N(t_r+t_{f0})]$ and the ring oscillator frequency of the test circuit of FIG. 2A is $f_{2A}=1/[N(t_{r0}+t_{f0})]$ then $t_r-t_{r0}=[1/f_{1A}-1/f_{2A}]/N$. Similarly, $t_f-t_{f0}=[1/f_{1B}-1/f_{2A}]/N$, where $f_{1B}$ is the ring oscillator frequency of the circuit of FIG. 1B.

Figure 2B:
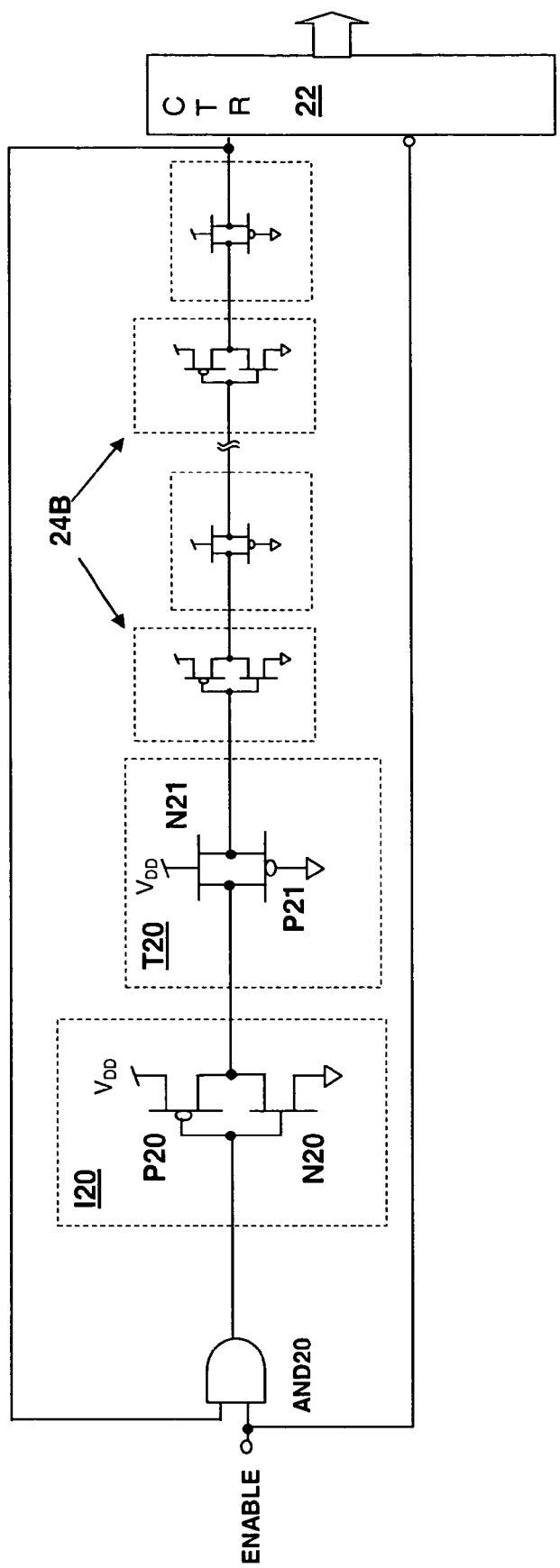

Referring now to FIG. 2B, another a reference ring oscillator or delay test circuit that can be used to provide reference baseline delay information for a test method in accordance with another embodiment of the invention is shown. The construction of the reference test circuit is similar to that of the reference test circuit of FIG. 2A, but pass gate T20 (and similar pass gates in subsequent stages 24B) is provided in between inverters I20. The delay time formulas above can be modified so that if the total delay of the N-stage reference circuit is given by $N(t_r+t_f)$ where $t_r$ is the rise time and $t_f$ is the fall time of each stage in the circuit of FIG. 2B and the delay through the N-stage circuits of FIGS. 1A and 1B are given by $N(t_r+t_{f0})$ and $N(t_{r0}+t_f)$, respectively, then the rise and fall time of pass gate T1 can be determined in a manner similar to that described above with respect to the circuit of FIG. 2A.

The difference between $t_r$ and $t_{r0}$ is given by $t_r-t_{r0}=[N(t_r+t_f)-N(t_r+t_{f0})]/N$ and similarly the difference between $t_f$ and $t_{f0}$ is given by $t_f-t_{f0}=[N(t_r+t_f)-N(t_{r0}+t_f)]/N$. If the ring oscillator frequency of the test circuit of FIG. 1A is $f_{1A}=1/[N(t_r+t_{f0})]$ and the ring oscillator frequency of the test circuit of FIG. 2B is $f_{2B}=1/[N(t_r+t_f)]$ then $t_r-t_{r0}=[1/f_{2B}-1/f_{1A}]/N$. Similarly, $t_f-t_{f0}=[1/f_{2B}-1/f_{1B}]/N$.

While the invention has been particularly shown and described with reference to the preferred embodiment thereof, it will be understood by those skilled in the art that the foregoing and other changes in form, and details may be made therein without departing from the spirit and scope of the invention.

What is claimed is:

1. A test circuit, comprising:
   at least one pass gate
   at least one drive device including a pull-up output and a pull-down output electrically isolated from each other, and wherein one of said outputs of said at least one drive device is connected to an input of said at least one pass gate and wherein another one of said outputs is connected to an output of said at least one pass gate, whereby a delay through said pass gate can be determined for state changes caused by said one of said outputs of said at least one drive device substantially independent of pass gate delay for an opposite state change; and a load circuit connected to said input of said at least one pass gate for simulating a loading of a transistor of said at least one drive device that provides said one of said outputs of said at least one drive device, wherein said load circuit comprises at least one disabled transistor connected in series between said output of said at least one pass gate and a power supply rail.

2. The test circuit of claim 1, wherein said at least one pass gate comprises a plurality of pass gates and said at least one drive device comprises a plurality of drive devices, wherein said pass gates are connected in a cascade configuration with each one of said drive devices interposed between each pair of said pass gates, and wherein a predetermined one of said outputs of each of said drive devices is connected to an input of a next one of said pass gates and wherein another one of said output is connected to an output of said next pass gate.

3. The test circuit of claim 2, wherein an output of a last one of said plurality of pass gates has an output coupled back to an input of a first one of pass gates, whereby said test circuit forms a ring oscillator having a frequency dependent on a delay through said plurality of pass gates.

4. The test circuit of claim 2, wherein said drive devices are split inverters, comprising:
a first transistor having a first channel connection connected to said pull-down output and a second channel connection coupled to a first power supply rail; and
and a pull-up transistor having a first channel connection connected to said pull-up output and a second channel connection coupled to a second power supply rail opposite the first power supply rail and wherein said first transistor and said second transistor have gate connections commonly connected to an output of a previous one of said plurality of pass gates.

5. The test circuit of claim 1, wherein said drive device is a split inverter, comprising:
a first transistor having a first channel connection connected to said pull-down output and a second channel connection coupled to a first power supply rail; and
and a pull-up transistor having a first channel connection connected to said pull-up output and a second channel connection coupled to a second power supply rail opposite the first power supply rail and wherein said first transistor and said second transistor have gate connections commonly connected to an input of said split inverter.

6. The test circuit of claim 1, further comprising a load circuit connected to said output of said at least one pass gate for simulating a loading of one or more disabled pass gates, said load circuit comprising a loading pass gate including transistors sized to simulate said loading and having an input connected to a power supply rail and control inputs connected to power supply rails corresponding to a disabled state of said of said control inputs.

7. The test circuit of claim 1, further comprising a load circuit connected to said output of said at least one pass gate for simulating a loading of a transistor of said at least one drive device that provides said another one of said outputs of said at least one drive device, wherein said load circuit comprises at least one disabled transistor connected in series between said output of said at least one pass gate and a power supply rail.

8. A method for measuring characteristics of a pass gate, said method comprising:
first propagating a state transition through a pass gate by supplying said state transition at an input of said pass gate;

second propagating an opposite state transition around said pass gate by supplying said opposite state transition at an output of said pass gate; and
observing a result of a delay of said state transition and said opposite state transition at an output of said pass gate, whereby performance of said pass gate is determined; and
simulating a loading of one or both outputs of said split inverters by introducing dummy loads at pass gate nodes to which the simulated outputs are not connected, wherein said first and second propagating propagates said state transition and said opposite state transition through a cascade of pass gates having interposed split inverters, wherein said observing determines a delay of said pass gate for said state transition from a total delay of said cascade of pass gates for said state transition.

9. The method of claim 8, wherein said cascade of pass gates is connected to form a ring oscillator and wherein said observing determines said delay of said pass gate for said state transition from a frequency of oscillation of said ring oscillator.

10. The method of claim 8, wherein said first and second propagating are performed by one or more drive devices, and wherein said method further comprises:
third propagating said state transition through another circuit simulating a cascade of one or more unsplit inverters;
fourth propagating said opposite state transition through said other test circuit;
second observing a result of a delay of said state transition and said opposite state transition at an output of said other test circuit; and
normalizing a result of said first observing with a result of said second observing, whereby a delay of said state transition through said pass gate can be determined independent of another delay introduced by said split inverters.

11. The method of claim 10, wherein said third propagating and fourth propagating propagate said state transition and said opposite state transition through said other circuit simulating a cascade of said one or more unsplit inverters with one or more interposed pass gates, whereby said normalizing normalizes said result of said first observing to said other delay and delays of both state transitions through said pass gates.

12. The method of claim 8, further comprising simulating a loading of one or more other pass gates of a multiplexer circuit by introducing dummy loads at pass gate outputs.

13. A test circuit, comprising:
a first transistor for causing a state change at an input of a pass gate and having a first channel connection coupled to a first power supply rail;
a second transistor causing an opposite state change to be asserted directly at an output of said pass gate and having a first channel connection coupled to a second power supply rail opposite said first power supply rail, wherein said first and second transistor have a common gate connection
a third transistor providing said pass gate, wherein a gate input of said third transistor is connected to a power supply rail that enables said pass gate, wherein a second channel connection of said first transistor is connected to a first channel connection of said third transistor that provides an input to said pass gate, wherein a second channel connection of said second transistor is connected to a second channel connection of said third transistor that provides an output of said pass gate, whereby said state change produced by said first transistor in response to a change in signal state at said common gate connection of said first and second transistors is provided through said pass gate, and whereby said opposite state change produced by said second transistor in response to said change in signal state bypasses said pass gate;

a fourth transistor providing a path through said pass gate in parallel with said third transistor and having a gate input connected to an opposite power supply rail that enables said fourth transistor, said fourth transistor having a polarity type opposite to that of said third transistor; and a fifth transistor having a first channel connection coupled to said second power supply rail, a second channel connection connected to said first channel connection of said third transistor and a gate input connected to disable said fifth transistor, wherein said fifth transistor provides a loading equivalent to that of said second transistor.

14. The test circuit of claim 13, further comprising a sixth transistor having a first channel connection coupled to said first power supply rail, a second channel connection connected to said second channel connection of said third transistor and a gate input connected to disable said sixth transistor, wherein said sixth transistor provides a loading equivalent to that of said first transistor.

15. The test circuit of claim 13, further comprising a second pass gate having an input connected to one of said first and second power supply rail, an output connected to said second channel connection of said third transistor and one or more select inputs connected to disable said second pass gate, wherein said second pass gate provides a loading equivalent to that of one or more additional pass gates in a multiplexer circuit.

* * * * *